US012588188B2

(12) United States Patent
 Kim et al.

(10) Patent No.: US 12,588,188 B2
(45) Date of Patent: Mar. 24, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jonghyeok Kim, Suwon-si (KR); Kang In Kim, Suwon-si (KR); Kyuwan Kim, Suwon-si (KR); Min-Cheol Kim, Suwon-si (KR); Youngseok Kim, Suwon-si (KR); Taewoong Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 385 days.

(21) Appl. No.: 18/240,512

(22) Filed: Aug. 31, 2023

(65) Prior Publication Data

US 2024/0172416 A1 May 23, 2024

(30) Foreign Application Priority Data

Nov. 22, 2022 (KR) ........................ 10-2022-0157564

(51) Int. Cl.
*H10B 12/00* (2023.01)

(52) U.S. Cl.
CPC ......... *H10B 12/315* (2023.02); *H10B 12/482* (2023.02); *H10B 12/485* (2023.02); *H10B 12/488* (2023.02)

(58) Field of Classification Search
CPC .. H10B 12/315; H10B 12/482; H10B 12/485; H10B 12/488; H10B 12/0335; H10B 12/34; H10B 12/053; H10B 12/48; H01L 23/5283; H01L 21/76838; H10D 62/40; H10D 62/60
See application file for complete search history.

(56) References Cited

U.S. PATENT DOCUMENTS

| | | | |
|---|---|---|---|
| 7,273,783 | B2 | 9/2007 | Kim et al. |
| 7,749,835 | B2 | 7/2010 | Li et al. |
| 9,818,843 | B2 | 11/2017 | Oh et al. |
| 11,217,669 | B2 | 1/2022 | An et al. |
| 2010/0052048 | A1 | 3/2010 | Kang |

FOREIGN PATENT DOCUMENTS

| | | |
|---|---|---|
| JP | 4029559 B2 | 10/2007 |
| KR | 10-0634404 B1 | 10/2006 |
| KR | 10-0908823 B1 | 7/2009 |

*Primary Examiner* — Elias Ullah
(74) *Attorney, Agent, or Firm* — Muir Patent Law, PLLC

(57) ABSTRACT

A semiconductor device includes a substrate having a substrate groove extending in a first direction, a gate insulating layer conformally covering an inner wall of the substrate groove, a metal-containing pattern on the gate insulating layer and filling a lower portion of the substrate groove, a silicon pattern on the metal-containing pattern in the substrate groove, and a word line capping pattern on the silicon pattern in the substrate groove, wherein the silicon pattern includes a first silicon pattern covering an upper surface of the metal-containing pattern and a sidewall of the gate insulating layer and having a pattern groove formed thereon and a second silicon pattern filling the pattern groove, the first silicon pattern having a first impurity concentration, and the second silicon pattern having a second impurity concentration less than the first impurity concentration.

20 Claims, 21 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0157564, filed on Nov. 22, 2022, in the Korean Intellectual Property Office, the entire contents of which are hereby incorporated by reference.

BACKGROUND

1. Field

Embodiments relate to a semiconductor device and a method of fabricating the same.

2. Description of the Related Art

Semiconductor devices are attractive in the electronic industry because of their small size, multi-functionality, and/or low fabrication costs. However, semiconductor devices have become highly integrated with developments in the electronic industry. Line widths of patterns of semiconductor devices have become more and more reduced for providing higher integration of the semiconductor devices. Recently, new and/or more expensive exposure techniques have been required for providing fine patterns in semiconductor devices, such that it has become difficult to highly integrate semiconductor devices. Thus, various kinds of research are being conducted for providing new integration techniques.

SUMMARY

A feature of embodiments is to provide a semiconductor device with improved reliability.

An additional feature of the embodiments is to provide a fabricating method for providing a semiconductor device with improved reliability.

A semiconductor device according to embodiments includes a substrate having a substrate groove extending in a first direction, a gate insulating layer conformally covering an inner wall of the substrate groove, a metal-containing pattern on the gate insulating layer and filling a lower portion of the substrate groove, a silicon pattern on the metal-containing pattern in the substrate groove, and a word line capping pattern on the silicon pattern in the substrate groove, the silicon pattern including a first silicon pattern covering an upper surface of the metal-containing pattern and a side surface of the gate insulating layer and having a pattern groove formed thereon and a second silicon pattern filling the pattern groove, the first silicon pattern having a first impurity concentration, and the second silicon pattern has a second impurity concentration that is less than the first impurity concentration.

A semiconductor device according to embodiments includes a substrate having a substrate groove extending in a first direction, a gate insulating layer conformally covering an inner wall of the substrate groove, a metal-containing pattern on the gate insulating layer and filling a lower portion of the substrate groove, a silicon pattern on the metal-containing pattern in the substrate groove, and a word line capping pattern on the silicon pattern in the substrate groove, the silicon pattern including a first silicon pattern covering an upper surface of the metal-containing pattern and a side surface of the gate insulating layer and having a pattern groove formed thereon and a second silicon pattern filling the pattern groove the first silicon pattern has a first silicon grain average size, and the second silicon pattern has a second silicon gratin average size greater than the first silicon grain average size.

A semiconductor device according to embodiments includes a substrate having a substrate groove extending in a first direction, a gate insulating layer conformally covering an inner wall of the substrate groove, a metal-containing pattern on the gate insulating layer and filling a lower portion of the substrate groove, a silicon pattern on the metal-containing pattern in the substrate groove, a word line capping pattern on the silicon pattern in the substrate groove, a first impurity region in the substrate at one side of the word line capping pattern, a second impurity region in the substrate on the other side of the word line capping pattern, a bit line extending in a second direction crossing the first direction on the substrate and connected to the first impurity region, a bit line contact between the bit line and the first impurity region, a bit line capping pattern on the bit line, a storage node contact on the second impurity region, and a landing pad on the storage node contact and partially covering the bit line capping pattern, the silicon pattern including a first silicon pattern covering an upper surface of the metal-containing pattern and a side surface of the gate insulating layer and having a pattern groove formed thereon, a second silicon pattern filling the pattern groove, and a void region positioned between the first silicon pattern and the second silicon pattern, the first silicon pattern having a first thickness at a sidewall of the gate insulating layer, the second silicon pattern having a first width, and the first thickness is 0.8 to 1.2 times the first width.

A method of fabricating a semiconductor device according to embodiments includes forming a substrate groove in the substrate, conformally forming a gate insulating layer in the groove of the substrate, stacking a metal-containing layer on the substrate to fill the substrate groove, etching back the metal-containing layer to form a metal-containing pattern filling a lower portion of the substrate groove, forming a first silicon layer having a first impurity concentration and a first thickness to cover an upper surface of the metal-containing pattern and an inner wall of the substrate groove, forming a second silicon layer having a second impurity concentration and a second thickness to fill the substrate groove, etching back the second silicon layer and the first silicon layer to form a silicon pattern in the substrate groove, and forming a word line capping pattern on the silicon pattern.

BRIEF DESCRIPTION OF THE DRAWINGS

Features will become apparent to those of skill in the art by describing in detail exemplary embodiments with reference to the attached drawings in which:

FIGS. 5B, 6B, 7B, 8A to 8D, 9B, and 10 are cross-sectional views sequentially showing a method of fabricating the semiconductor device shown in FIG. 2A according to embodiments.

DETAILED DESCRIPTION

Hereinafter, embodiments will be described in detail with reference to the drawings.

Figure 1:
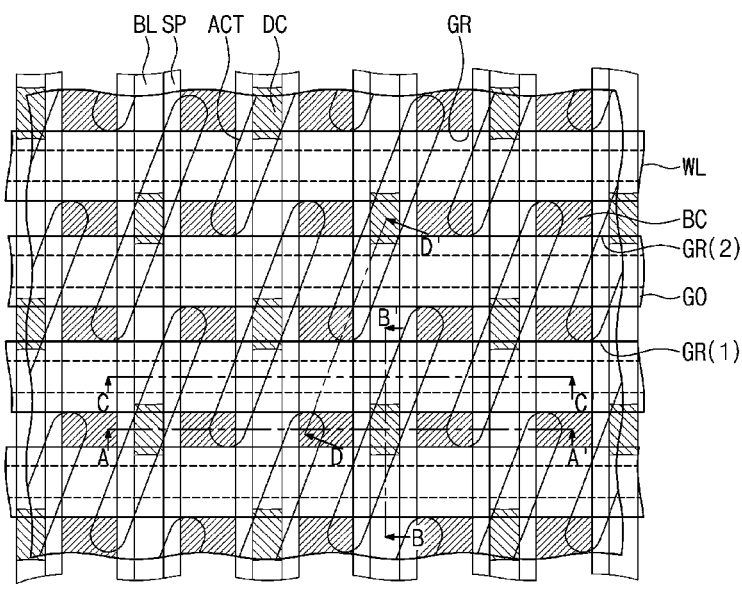
FIG. 1 is a plan view showing a semiconductor device according to embodiments.
Figure 1:
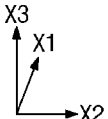
Figure 2A:
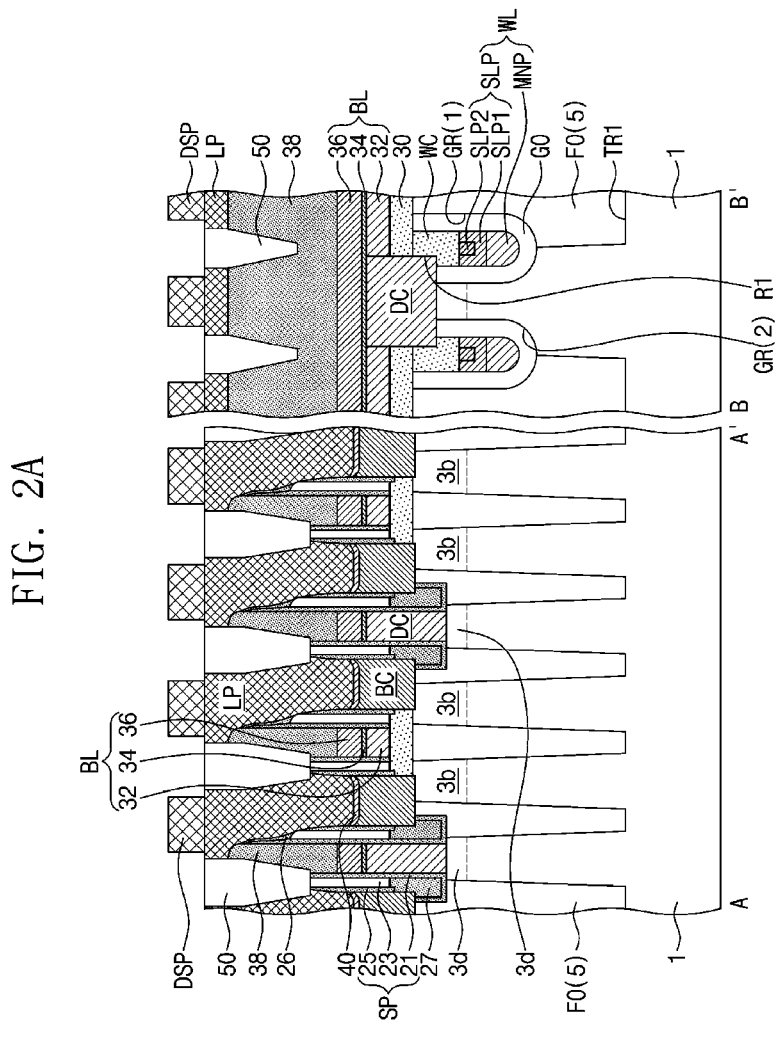
FIG. 2A is a cross-sectional view showing the semiconductor device shown in FIG. 1 taken along line A-A' and line B-B'.
Figure 2B:
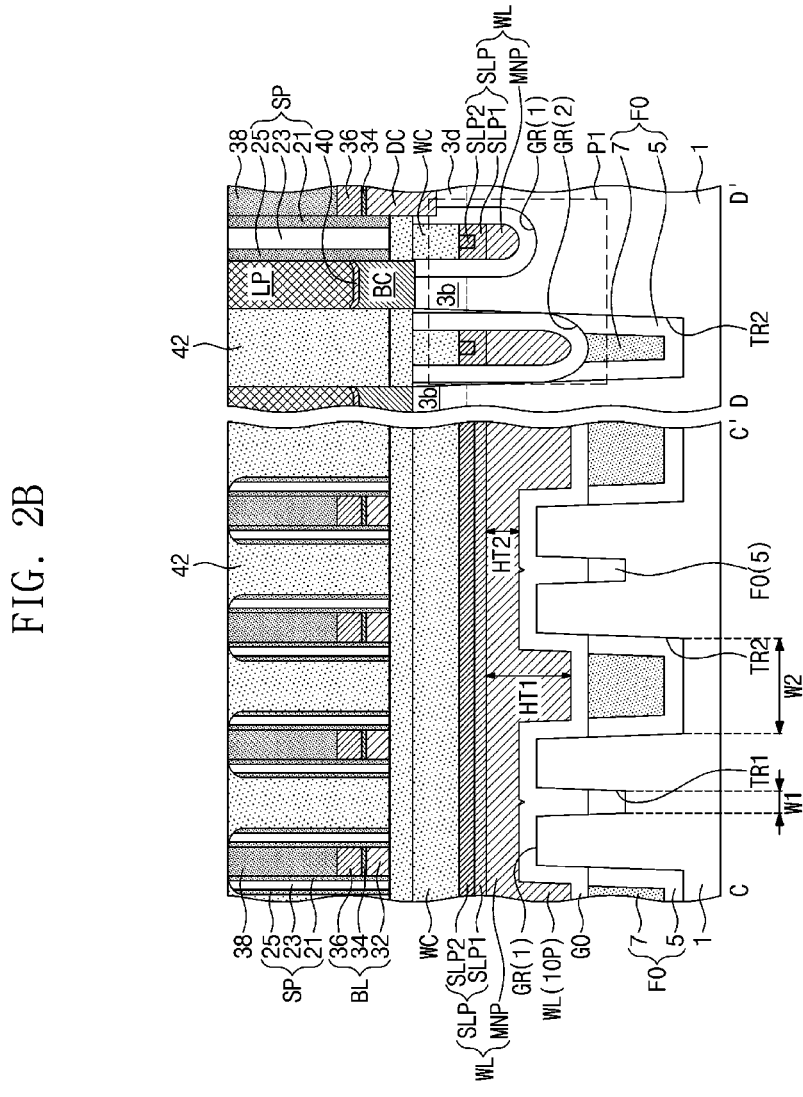
FIG. 2B is a cross-sectional view showing the semiconductor device shown in FIG. 1 taken along line C-C' and line D-D'.

Referring to FIGS. 1, 2A and 2B, a substrate 1 is provided. The substrate 1 may be, for example, a silicon single crystal substrate or a silicon on insulator (SOI) substrate. A device isolation layer FO may be on the substrate 1 to define active regions ACT. Each of the active regions ACT may have an isolated shape. Each of the active regions ACT may have a bar shape that is elongated in a first direction X1 when viewed in a plan view. The active regions ACT may correspond respectively to portions of the substrate 1 surrounded by the device isolation layer FO. The substrate 1 may include a semiconductor material. For example, the substrate 1 may be a silicon substrate, a germanium substrate, or a silicon-germanium substrate. The device isolation layer FO may include oxide (e.g., silicon oxide), nitride (e.g., silicon nitride), and/or oxynitride (e.g., silicon oxynitride). The active regions ACT may be arranged parallel to each other in the first direction X1. An end of one active region ACT may be adjacent to a center of other active regions ACT adjacent thereto.

The device isolation layer FO may be in a first trench TR1 and in a second trench TR2 located in the substrate 1, as shown in FIG. 2B. The first trench TR1 may have a first width W1 in a second direction X2 crossing the first direction X1. The second trench TR2 may have a second width W2 in the second direction X2. The second width W2 may be greater than the first width W1.

The device isolation layer FO may include a first device isolation layer 5 and a second device isolation layer 7. The first device isolation layer 5 and the second device isolation layer 7 may each independently include at least one of silicon oxide, silicon nitride, and silicon oxynitride. The second device isolation layer 7 may include a material having an etching selectivity with the first device isolation layer 5. In some implementations, the second device isolation layer 7 may include silicon nitride and the first device isolation layer 5 may include silicon oxide.

As shown in FIG. 2B, the first device isolation layer 5 may fill at least a lower portion of the first trench TR1 and cover sidewalls and bottom surfaces of the second trench TR2. The second device isolation layer 7 may be in contact with the first device isolation layer 5 in the second trench TR2. The second device isolation layer 7 may fill at least a lower portion of the second trench TR2. The first device isolation layer 5 and the second device isolation layer 7 may be recessed and upper sidewalls of the first trench TR1 and the second trench TR2 may be exposed.

Substrate grooves GR may be formed in the substrate 1 and the device isolation layer FO. The substrate grooves GR may extend in the second direction X2 and may be spaced apart from each other in a third direction X3 that respectively crosses the first and second directions X1 and X2. Bottom surfaces of the substrate grooves GR may have a concavo-convex structure as shown in FIG. 2B. An upper surface of the substrate 1 at a bottom surface of the substrate grooves GR may be higher than an upper surface of the device isolation layer FO.

A gate insulating layer GO may be in each of the substrate grooves GR. The gate insulating layer GO may include silicon oxide and/or a high dielectric layer. The high dielectric layer may include a material having a dielectric constant higher than that of the silicon oxide. The high dielectric layer may include, for example, a metal oxide such as aluminum oxide. The gate insulating layer GO may conformally cover inner walls and bottom surfaces of the substrate grooves GR. At the bottom of the substrate grooves GR, the gate insulating layer GO may have a concavo-convex structure. The substrate grooves GR may include a first substrate groove GR(1) and a second substrate groove GR(2) adjacent to each other.

A portion of the gate insulating layer GO may be inserted into the first trench TR1 to fill an upper portion of the first trench TR1. Another portion of the gate insulating layer GO may be inserted into the second trench TR2 to cover an inner wall of the second trench TR2 and an upper surface of the device isolation layer FO.

A word line WL may be in each of the substrate grooves GR. Lower surfaces of the word lines WL may be curved. A lower surface of the word line WL on the device isolation layer FO may be lower than a lower surface of the word line WL on the active portion ACT.

The word line WL may include a metal-containing pattern MNP and a silicon pattern SLP thereon. The metal-containing pattern MNP may include, as non-limiting examples, at least one of TiN, Mo, W, Cu, Al, TaN, Ru, and Ir. The metal-containing pattern MNP may fill at least a lower portion of the substrate groove GR. An upper surface of the metal-containing pattern MNP may be flat, but a lower surface of the metal-containing pattern MNP may have a concavo-convex structure.

As shown in FIG. 2B, the metal-containing pattern MNP may include a first conductive portion that overlaps the device isolation layer FO or the second trench TR2 and that have a first vertical length HT1, and a second conductive portion that do not overlap the isolation layer FO and that have a second vertical length HT2. The first vertical length HT1 may be longer than the second vertical length HT2.

Figure 3A:
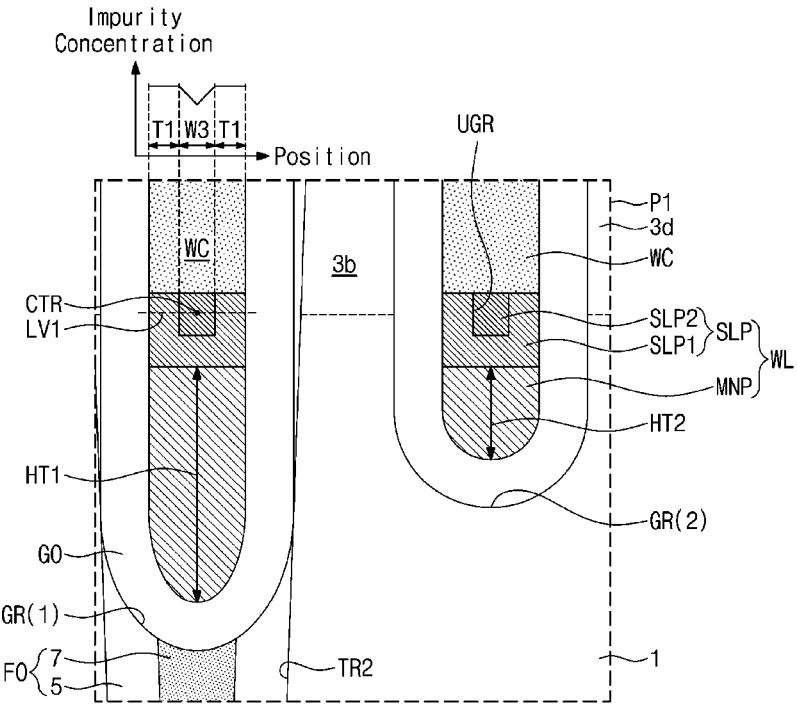
FIGS. 3A to 3C are enlarged views showing a portion 'P1' shown in FIG. 2B according to embodiments.

As shown in FIG. 3A, the metal-containing pattern MNP positioned in the first substrate groove GR(1) and overlapping the device isolation layer FO has the first vertical length HT1. The metal-containing pattern MNP positioned in the second substrate groove GR(2) and overlapping the substrate 1 may have the second vertical length HT2 that is smaller than the first vertical length HT1.

The silicon pattern SLP may include a first silicon pattern SLP1 and a second silicon pattern SLP2. The first silicon pattern SLP1 may cover the upper surface of the metal-containing pattern MNP and an inner wall of the gate insulating layer GO. As shown in FIG. 3A, a pattern groove UGR may be formed on an upper surface of the first silicon pattern SLP1. The second silicon pattern SLP2 may be in the pattern groove UGR and may fill the pattern groove UGR. The second silicon pattern SLP2 may be simultaneously spaced apart from the metal-containing pattern MNP and the gate insulating layer GO.

The first silicon pattern SLP1 may have a first thickness T1 on the inner wall of the gate insulating layer GO. The second silicon pattern SLP2 may have a third width W3. The first thickness T1 may be 0.8 to 1.2 times the third width W3.

Impurities may be doped into the first and second silicon patterns SLP1 and SLP2. For example, the impurities may be N-type impurities, preferably phosphorus (P). A concentration of the impurities in the second silicon pattern SLP2 may be less than a concentration of the impurities in the first silicon pattern SLP1. The concentration of the impurities may decrease as the impurities come closer to a center CTR of the second silicon pattern SLP2. The second impurity concentration at a center of the second silicon pattern is lower than the second impurity concentration at an edge of the second silicon pattern. For example, the impurity concentration in the first silicon pattern SLP1 may be $8e^{20}/cm^3$ to $30e^{20}/cm^3$. The impurity concentration at the center CTR of the second silicon pattern SLP2 may be 0 to $8e^{20}/cm^3$. A concentration of the impurities at a level LV1 of the center CTR of the second silicon pattern SLP2 may vary depending on a position, as shown in the graph of FIG. 3A.

Figure 3B:
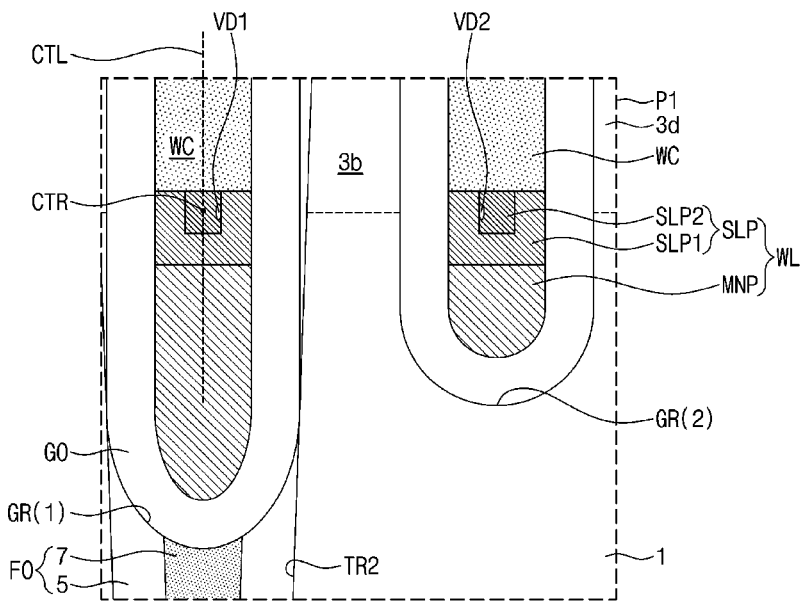

As shown in FIG. 3B, the silicon pattern SLP may have void regions VD1 and VD2. The void regions VD1 and VD2 are not on a virtual center line CTL passing through the center CTR of the second silicon pattern SLP2. The virtual center line CTL may also be referred to as 'a center line of the substrate grooves GR'. The void regions VD1 and VD2 may be positioned between the virtual center line CTL and the sidewall of the silicon pattern SLP. The void regions VD1 and VD2 may be spaced apart from the gate insulating layer GO. For example, the void regions VD1 and VD2 may be positioned between the first silicon pattern SLP1 and the second silicon pattern SLP2. The void regions VD1 and VD2 may be in contact with right and/or left inner walls of the first silicon pattern SLP1. In embodiments, the void regions VD1 and VD2 may be spaced apart from the gate insulating layer GO. Thus, the generation of a leakage current due to the void regions VD1 and VD2 may be prevented/minimized. Also, the void regions VD1 and VD2 may not be positioned on the virtual center line CTL that passes through the center CTR of the second silicon pattern SLP2. Thus, electrical resistance of the word line may be reduced. Accordingly, a semiconductor device having improved reliability may be provided. Herein, the void regions VD1 and VD2 may also be referred to as a 'void' or a 'seam'.

Figure 3C:
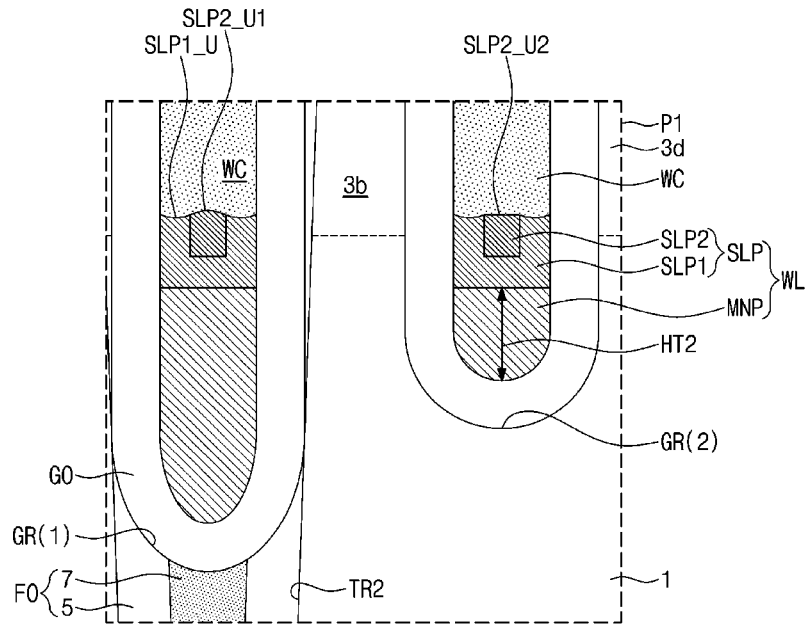

Upper surfaces of the first and second silicon patterns SLP1 and SLP2 may be flat as shown in FIG. 3A. In some implementations, as shown in FIG. 3C, an upper surface SLP1_U of the first silicon pattern SLP1 may be depressed. The second silicon pattern SLP2 may have a convex upper surface SLP2_U1 or a flat upper surface SLP2_U2.

Figure 3D:
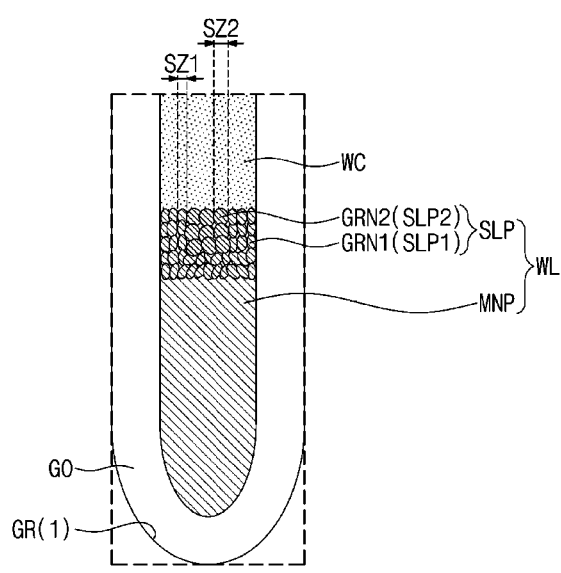
FIG. 3D is a partially enlarged view showing a word line according to embodiments.

As shown in FIG. 3D, the first silicon pattern SLP1 may include a plurality of first silicon grains GRN1. The first silicon grains GRN1 may have a first silicon grain average size SZ1. The second silicon pattern SLP2 may include a plurality of second silicon grains GRN2. The second silicon grains GRN2 may have a second silicon grain average size SZ2. The second silicon grain average size SZ2 may be greater than or equal to the first silicon grain average size SZ1.

A first impurity region 3d may be in each of the active regions ACT between a pair of word lines WL. A pair of second impurity regions 3b may be in both edge regions of each of the active regions ACT, respectively. The first and second impurity regions 3d and 3b may be doped with, for example, N-type impurities. The first impurity region 3d may correspond to a common drain region and the second impurity regions 3b may correspond to a source region. Each of the word lines WL and the first and second impurity regions 3d and 3b adjacent thereto may constitute a transistor. The word lines WL may be in the substrate grooves GR having curved lower surfaces. A channel length of a channel region under the word lines WL may be increased within a limited plane area. Therefore, a short-channel effect and the like may be minimized.

A work function of a material constituting the metal-containing pattern MNP may be smaller than a work function of silicon constituting the silicon pattern SLP. For example, the work function of a material constituting the metal-containing pattern MNP may be 4.2 eV or less. Due to the difference in work function, an electric field around the silicon pattern SLP adjacent to the first and second impurity regions 3d and 3b may decrease when the word line WL is turned off. As a result, leakage current may be reduced during an OFF operation. In addition, when the word line WL is turned ON due to the difference in work function, inversion around the silicon pattern SLP may be improved to increase the ON current. Accordingly, ON/OFF controllability of the word line WL may be improved.

Upper surfaces of the word lines WL may be lower than upper surfaces of the active regions ACT. A word line capping pattern WC may be on each of the word lines WL. The word line capping patterns WC may have a line shape that extends in a longitudinal direction of the word lines WL. The word line capping pattern WC may cover the entire upper surface of the word lines WL. The word line capping patterns WC may fill the substrate grooves GR on the word lines WL. The word line capping pattern WC may be formed of, for example, a silicon nitride layer.

An interlayer insulating pattern 30 may be on the substrate 1. The interlayer insulating pattern 30 may be formed of at least one single layer or of multiple layers selected from a silicon oxide layer, a silicon nitride layer, and a silicon oxynitride layer. The interlayer insulating patterns 30 may be formed in a form of islands spaced apart from each other when viewed in a plan view. In some implementations, the interlayer insulating pattern 30 may be formed in a planar mesh shape. Upper portions of the interlayer insulating pattern 30, the substrate 1, the device isolation layer FO, and the word line capping pattern WC may be partially recessed to form a recess region R1.

Bit lines BL may be on the interlayer insulating pattern 30. The bit lines BL may cross the word line capping patterns WC and word lines WL. As shown in FIG. 1, the bit lines BL may be parallel to the third direction X3 crossing the first and second directions X1 and X2.

The bit line BL may include a bit line polysilicon pattern 32, a bit line anti-diffusion pattern 34, and a bit line wiring pattern 36 sequentially stacked. The bit line polysilicon pattern 32 may include polysilicon doped with impurities. The bit line anti-diffusion pattern 34 may include at least one of titanium, titanium nitride (TiN), titanium silicon nitride (TiSiN), tantalum, tantalum nitride, and tungsten nitride. The bit line wiring pattern 36 may include, for example, a metal such as tungsten, aluminum, or copper. A bit line capping pattern 38 may be on each of the bit lines BL. The bit line capping patterns 38 may be formed of an insulating material such as silicon nitride.

Bit line contacts DC may be in the first recess region R1 crossing the bit lines BL. The bit line contacts DC may include polysilicon that is doped with impurities or a polysilicon that is undoped. In the B-B' cross section of FIG. 2A, one sidewall of the bit line contact DC may be in contact with a sidewall of the interlayer insulating pattern 30. Referring to the plan view of FIG. 1, some of side surfaces of the bit line contact DC may be concave. The bit line contact DC may electrically connect the first impurity region 3*d* and the bit line BL.

A lower buried insulating pattern 27 may be in the first recess region R1 where the bit line contact DC is not disposed. The lower buried insulating pattern 27 may be formed of at least one single layer or multiple layers selected from a group including a silicon oxide layer, a silicon nitride layer, and a silicon oxynitride layer.

Storage node contacts BC may be between an adjacent pair of the bit lines BL. The storage node contacts BC may be spaced apart from each other. The storage node contacts BC may include polysilicon that is doped with impurities or polysilicon that is undoped. Upper surfaces of the storage node contacts BC may be concave.

An insulation fence 42 may be between the bit lines BL and the storage node contacts BC. The insulating fence 42 may be formed of, for example, an insulating layer such as a silicon nitride layer, a silicon oxide layer, or a silicon oxynitride layer. A height of an upper end of the insulation fence 42 may be higher than a height of an upper end of the storage node contacts BC.

A bit line spacer SP may be interposed between the bit line BL and the storage node contact BC. The bit line spacer SP may also cover sidewalls of the bit line capping pattern 38. The bit line spacer SP may include first to third spacers 21, 23, and 25 sequentially disposed from the sidewall of the bit line BL. The first and third spacers 21 and 25 may include a material having etching selectivity with the second spacer 23. For example, the first and third spacers 21 and 25 may include silicon nitride. The second spacer 23 may include silicon oxide. In some implementations, the second spacer 23 may be an air gap.

The first spacer 21 may extend downwardly to cover a sidewall of the bit line contact DC. The first spacer 21 may be interposed between the lower buried insulating pattern 27 and the device isolation layer FO. In the A-A' cross section of FIG. 2A, an upper end of the first spacer 21 may be higher than upper ends of the second and third spacers 23 and 25. An upper sidewall of the first spacer 21 may not be covered by the second and third spacers 23 and 25. Accordingly, a formation margin of a subsequent landing pad LP may be increased. Accordingly, it may be possible to prevent a connection failure between the landing pad LP and the storage node contact BC.

An upper portion of the first spacer 21 may have a smaller thickness than a lower portion thereof. The upper sidewall of the first spacer 21 may be covered with a fourth spacer 26. The fourth spacer 26 may include, for example, silicon nitride. The fourth spacer 26 may serve to reinforce the upper portion of the thinned first spacer 21.

A storage node ohmic layer 40 may be on the storage node contact BC. The storage node ohmic layer 40 may include metal silicide. A landing pad LP may be on the storage node ohmic layer 40. Although not shown, a diffusion barrier may be interposed between the storage node ohmic layer 40 and the landing pad LP. The diffusion barrier may include a metal nitride. The landing pad LP may be formed of a metal-containing material such as tungsten. An upper portion of the landing pad LP may cover an upper surface of the bit line capping pattern 38. A center of the landing pad LP may shift from a center of the storage node contact BC in the second direction X2. A portion of the bit line BL may vertically overlap the landing pad LP.

A landing pad separation pattern 50 may be between the landing pads LP. The landing pad separation pattern 50 may have, for example, a single layer or a multilayer structure of at least one of silicon oxide, silicon nitride, silicon oxynitride, and SiOC. The landing pad separation pattern 50 may extend downward and pass through a portion of the bit line capping pattern 38 to contact the second spacer 23.

A data storage unit DSP may be on the landing pads LP. The data storage unit DSP may be a capacitor including a lower electrode, a dielectric layer, and an upper electrode. In some implementations, the data storage unit DSP may include a magnetic tunnel junction pattern. In some implementations, the data storage unit DSP may include a phase change material or a variable resistance material.

Figure 4:
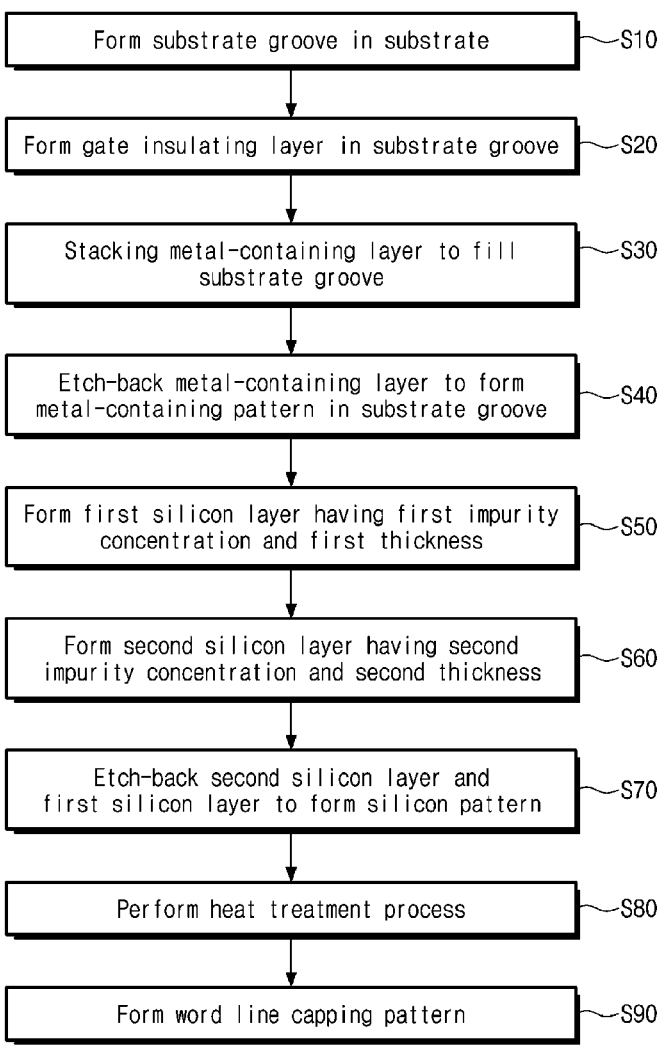
FIG. 4 is a flowchart sequentially showing a method of fabricating a semiconductor device according to embodiments.
Figure 5A:
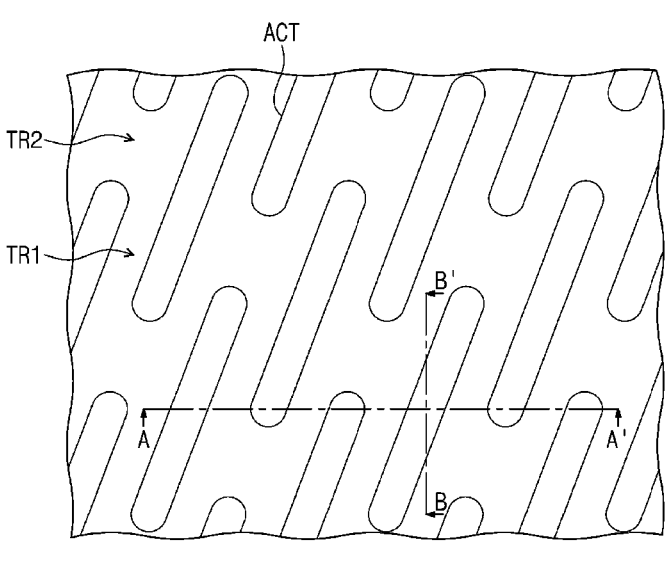
FIGS. 5A, 6A, 7A, and 9A are plan views sequentially showing a method of fabricating the semiconductor device shown in FIG. 1 according to embodiments.

FIG. 4 is a flowchart sequentially illustrating a method of fabricating a semiconductor device according to embodiments. FIGS. 5A, 6A, 7A, and 9A are plan views sequentially illustrating a method of fabricating a semiconductor device having the plan view of FIG. 1 according to embodiments. FIGS. 5B, 6B, 7B, 8A to 8D, 9B, and 10 are cross-sectional views sequentially illustrating a method of fabricating a semiconductor device having the cross-sections of FIG. 2A according to embodiments. FIGS. 5B, 6B, and 7B are cross-sectional views of FIGS. 5A, 6A, 7A, and 9A taken along lines A-A' and B-B'.

Figure 5B:
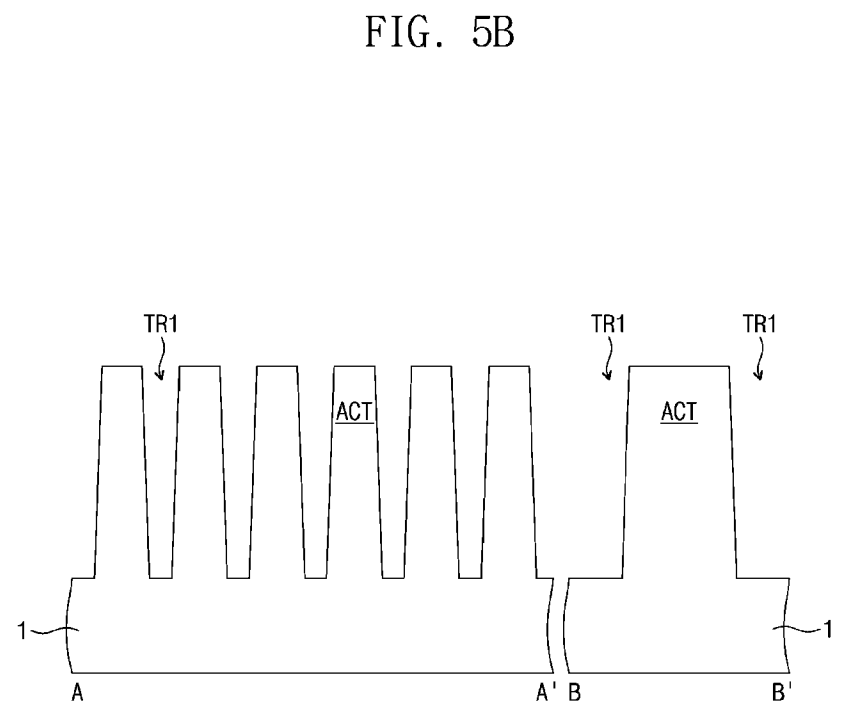

Referring to FIGS. 2B, 5A and 5B, a substrate 1 is prepared. The substrate 1 is etched to form first trenches TR1 and second trenches TR2 while defining active regions ACT. As illustrated in FIG. 3B, the second trenches TR2 are formed to have a second width W2 that is greater than a first width W1 of the first trenches TR1. Accordingly, the second trenches TR2 may be formed deeper than the first trenches TR1 due to a loading effect.

Figure 6A:
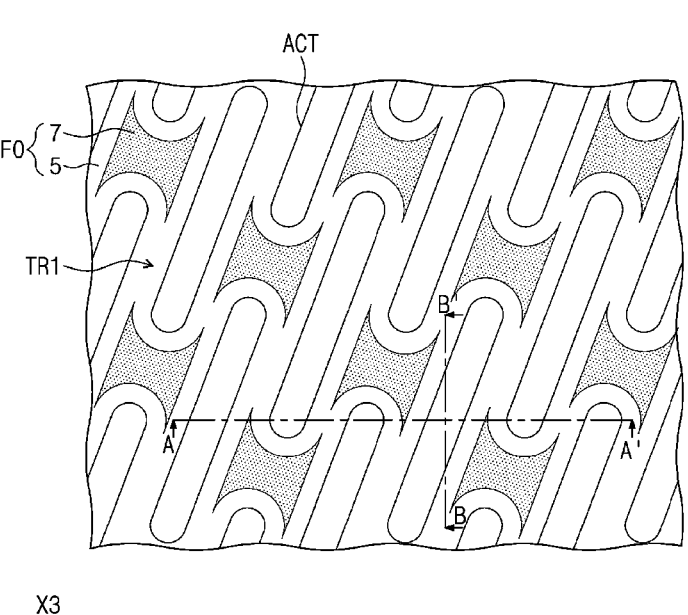
Figure 6B:
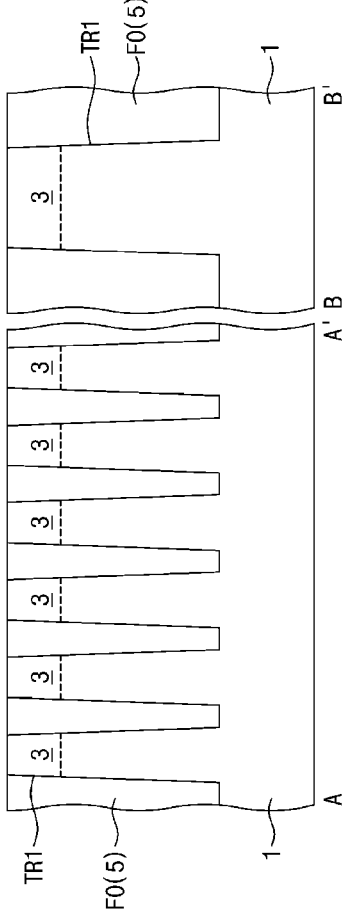
Figure 7A:
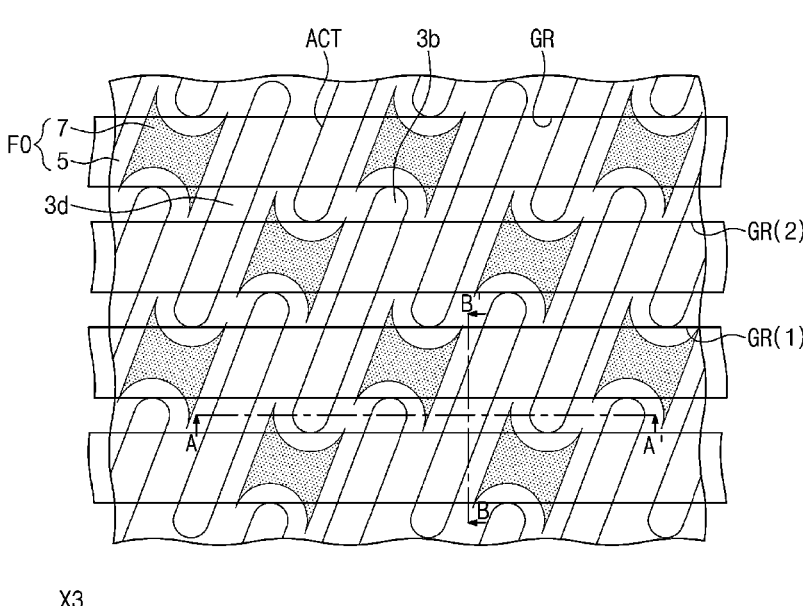

Referring to FIGS. 2B, 6A and 6B, a first device isolation layer 5 is conformally formed on the entire surface of the substrate 1. The first device isolation layer 5 may be formed to a thickness that fills the first trenches TR1 but does not fill the second trenches TR2. As a result, the first device isolation layer 5 may fill the first trenches TR1. A second device isolation layer 7 is formed on the first device isolation layer 5 to fill the second trenches TR2. The first device isolation layer 5 and the second device isolation layer 7 on the substrate 1 are removed by a chemical mechanical polishing (CMP) process or an etch-back process, to form a device isolation layer FO in the first trenches TR1 and the second trenches TR2. In the device isolation layer FO, the second device isolation layer 7 may have the shape shown in FIG. 6A when viewed in a plan view. In addition, an ion implantation process may be performed to form impurity regions 3 adjacent to a front surface of the substrate 1.

Figure 7B:
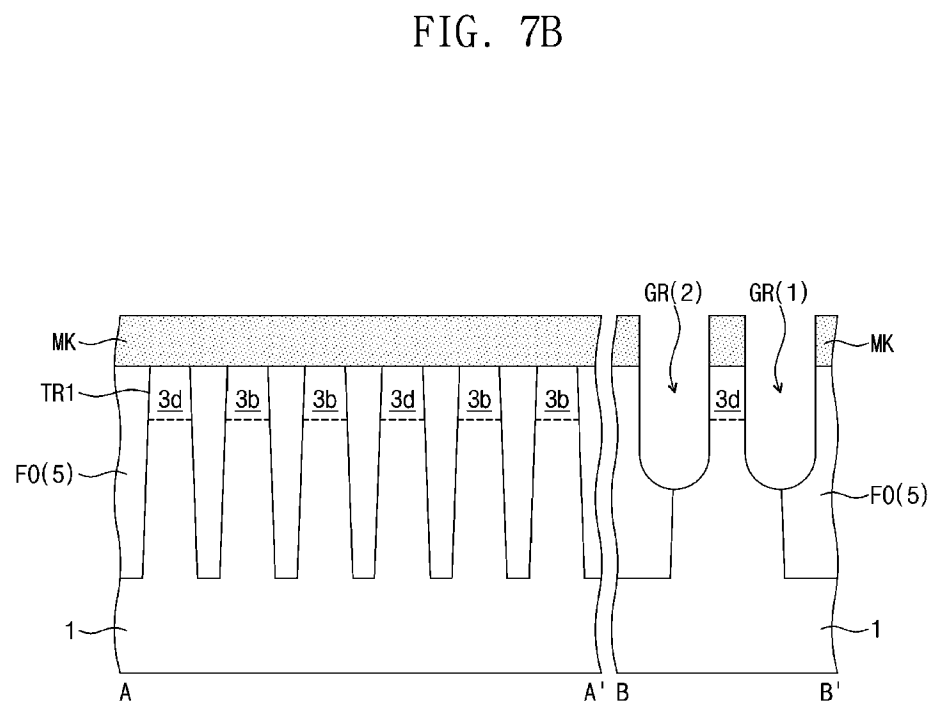

Referring to FIGS. 4, 7A, and 7B, a mask pattern MK is formed on the entire surface of the substrate 1 to define positions of substrate grooves GR. The mask pattern MK may include at least one of a photoresist pattern, spin on hardmask (SOH), SiOC, SiON, and silicon germanium. The substrate 1 and the device isolation layer FO may be etched using the mask pattern MK as an etching mask to form substrate grooves GR on the substrate 1 (in S10). Bottom surfaces of the substrate grooves GR may have a concavo-convex structure. By forming the substrate grooves GR, the impurity regions 3 may be divided into first and second impurity regions 3*d* and 3*b*. The substrate grooves GR may include first and second grooves GR(1) and GR(2).

Figure 8A:
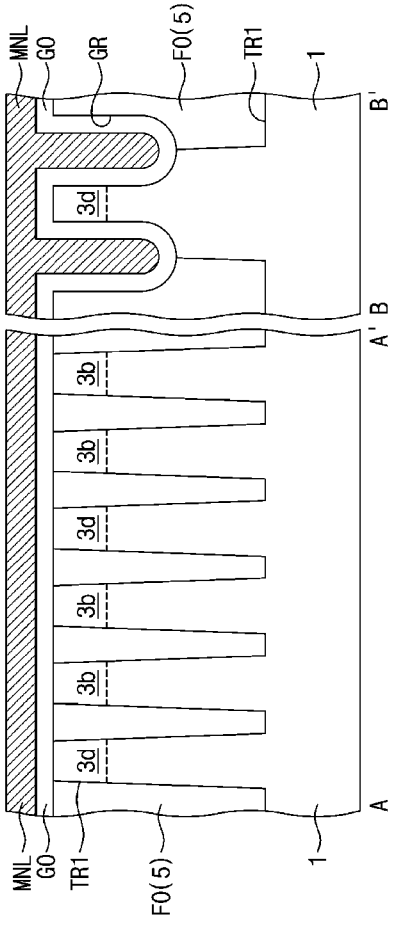

Referring to FIGS. 4 and 8A, the mask pattern MK may be removed. A gate insulating layer GO may be conformally formed on the entire surface of the substrate 1 (in S20). Then, a metal-containing layer MNL may be stacked on the gate insulating layer GO to fill the substrate grooves GR (in S30). The gate insulating layer GO and the metal-containing layer MNL may be formed by chemical vapor deposition (CVD) or atomic layer deposition (ALD) by supplying source gases, respectively.

Figure 8B:
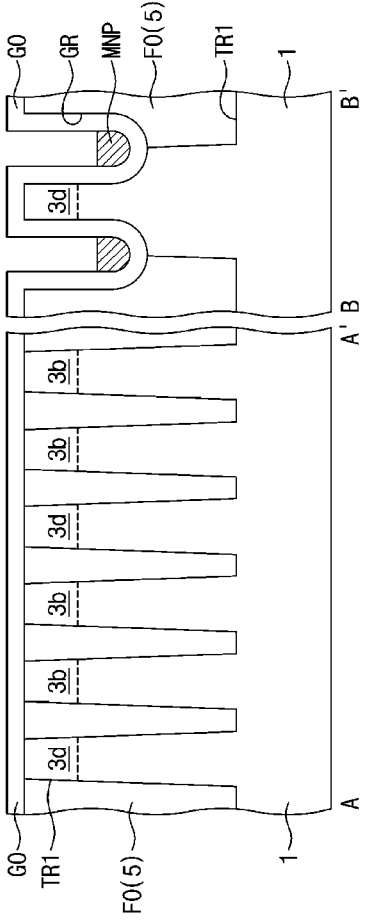

Referring to FIGS. 4 and 8B, the metal-containing layer MNL may be etched back to form metal-containing patterns MNP in the substrate groove GR (in S40). After the metal-containing patterns MNP are formed, an upper surface of the gate insulating layer GO in the substrate groove GR may be exposed.

Figure 8C:
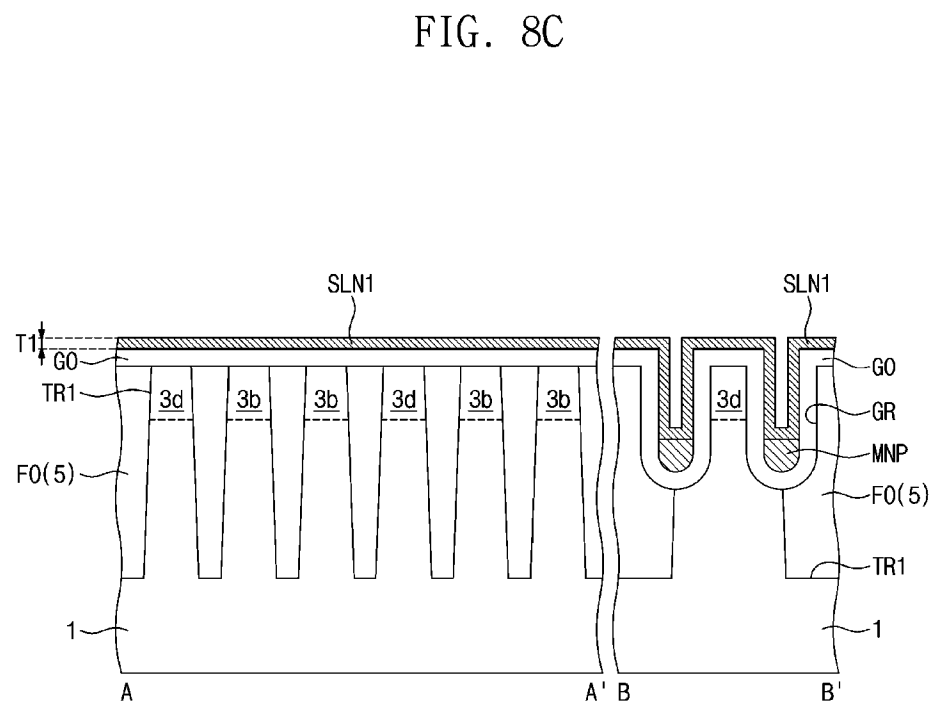

Referring to FIGS. 4 and 8C, a first silicon layer SLN1 having a first impurity concentration may be conformally formed to a first thickness T1 on the entire surface of the substrate 1 (in S50). The first thickness T1 may correspond to a thickness that does not completely fill the substrate groove GR. The first silicon layer SLN1 may be an amorphous silicon layer. The first silicon layer SLN1 may be deposited by chemical vapor deposition (CVD) or atomic layer deposition (ALD). When the first silicon layer SLN1 is formed, impurities of a first conductivity type, for example, N-type phosphorus (P) may be doped with the first impurity concentration by an in-situ manner. The first impurity concentration may be $8e^{20}/cm^3$ to $30e^{20}/cm^3$.

Figure 8D:
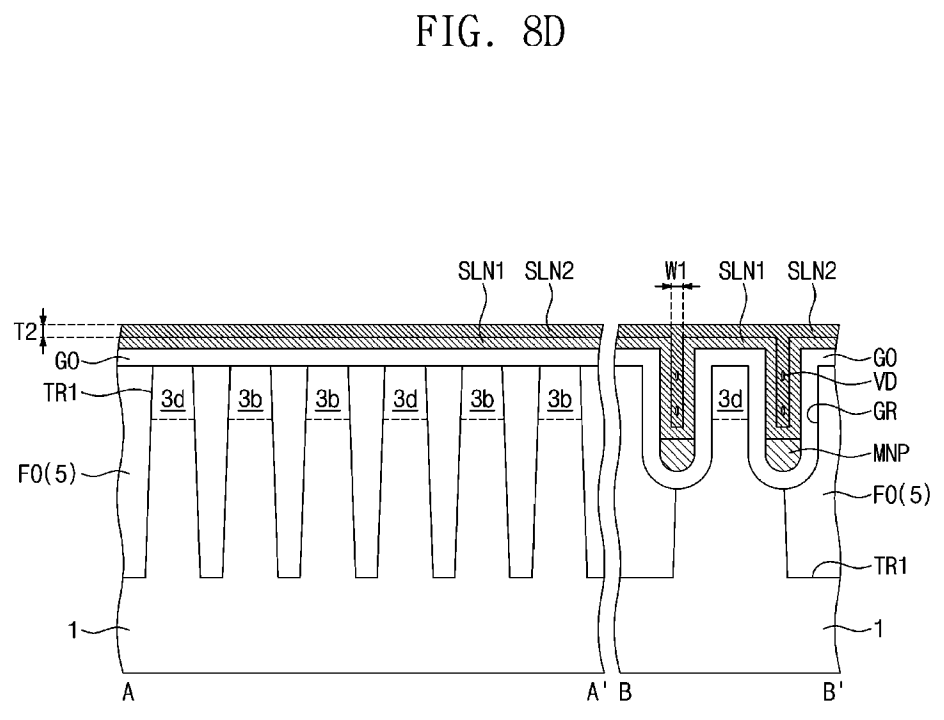

Referring to FIGS. 4 and 8D, a second silicon layer SLN2 having a second impurity concentration may be conformally formed to have a second thickness T2 on the entire surface of the substrate 1 (in S60). The second thickness T2 may be equal to or greater than ½ of the third width W3 of the second silicon pattern SLP2 as shown in FIG. 3A. The second silicon layer SLN2 may be an amorphous silicon layer. The second silicon layer SLN2 may be deposited by chemical vapor deposition (CVD) or atomic layer deposition (ALD). When the second silicon layer SLN2 is formed, impurities of the first conductivity type, for example, N-type phosphorus (P), may be doped with the second impurity concentration by an in-situ manner. The second impurity concentration may be less than the first impurity concentration. The second impurity concentration may be 0 to $8e^{20}/cm^3$. When the second silicon layer SLN2 is formed, voids VD may be formed in the second silicon layer SLN2. In this case, voids VD may be formed on a center line (CTL of FIG. 3B) of the substrate grooves GR.

Figure 9A:
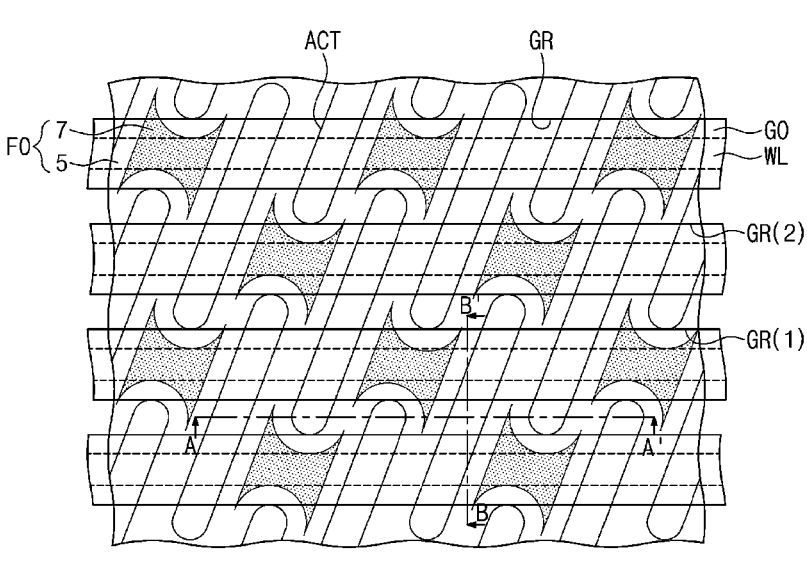
Figure 9B:
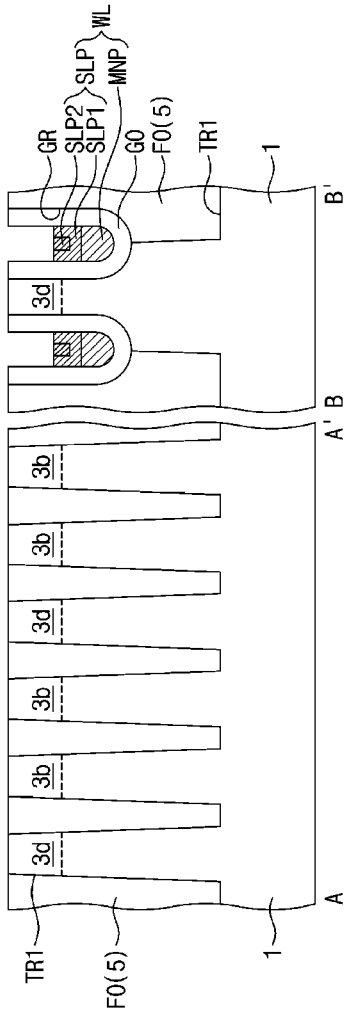

Referring to FIGS. 4, 9A, and 9B, the second silicon layer SLN2 and the first silicon layer SLN1 may be etched back to form a silicon pattern SLP (in S70). The silicon pattern SLP may include a first silicon pattern SLP1 formed as a portion of the first silicon layer SLN1 and a second silicon pattern SLP2 formed as a portion of the second silicon layer SLN2. In the etch-back process, the etch rate of the first silicon pattern SLP1 having a relatively high impurity concentration may be greater than the etch rate of the second silicon pattern SLP2 having a relatively small or zero impurity concentration. As a result, because the first silicon pattern SLP1 is more easily etched, the first silicon pattern SLP1 may be formed to have a recessed upper surface SLP1_U as shown in FIG. 3C, while the second silicon pattern SLP2 may have a convex upper surface SLP2_U1 or a flat upper surface SLP2_U2.

Referring to FIG. 4, a heat treatment process may be performed (in S80). The heat treatment process in S80 may be carried out at a high temperature, for example, at a temperature of 800° C. to 1200° C. The heat treatment process may be one of Rapid Thermal Anneal (RTA), Spike Rapid Thermal Anneal (SRTA), Flash Rapid Thermal Anneal (FRTA), Laser Anneal, Furnace Anneal, and Furnace/Laser Anneal. The first and second silicon patterns SLP1 and SLP2 in an amorphous state may be changed to a crystalline state by the heat treatment process. Thus, the first and second silicon grains GRN1 and GRN2 of FIG. 3D may be formed. In this case, the first silicon pattern SLP1 having the relatively high impurity concentration may have large influence on the impurities. Thus an average size SZ1 of first silicon grains GRN1 may be relatively small. The second silicon pattern SLP2 having the relatively small or zero impurity concentration may have a slight impurity influence. Thus an average size SZ2 of second silicon grains GRN2 may be relatively large.

During the heat treatment process in S80, the voids VD of FIG. 8D may move. The voids VD may be pushed to an edge of the second silicon pattern SLP2 by the second silicon grains GRN2 in the second silicon pattern SLP2, and may be blocked by the first silicon pattern SLP1. Due to a difference in impurity concentration between the second silicon pattern SLP2 and the first silicon pattern SLP1, the voids VD may be positioned between the second silicon pattern SLP2 and the first silicon pattern SLP1. As a result, the voids VD may not come into contact with the gate insulating layer GO. Accordingly, a leakage current generated by the voids VD in contact with the gate insulating layer GO may be prevented/minimized during the operation of the semiconductor device. Therefore, a semiconductor device with improved reliability may be provided.

Figure 10:
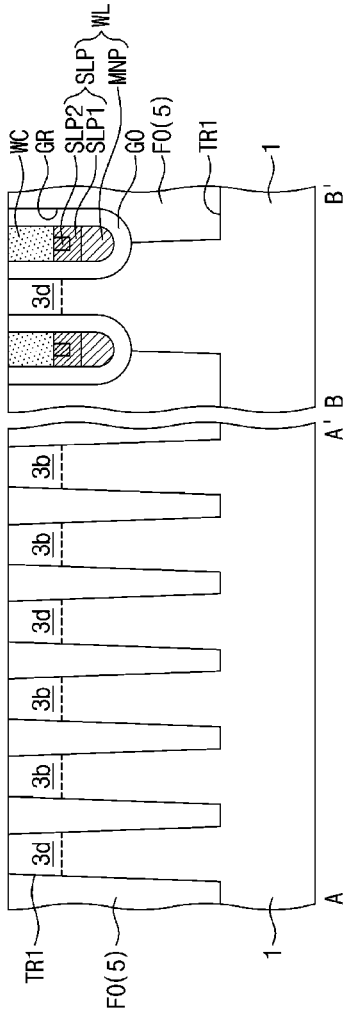

Referring to FIGS. 4 and 10, a word line capping pattern WC may be formed in the substrate groove GR (in S90). To this end, a word line capping layer (not shown) may be formed on the entire surface of the substrate 1 to fill the upper portion of the substrate groove GR. An etch-back or CMP process may be performed on the word line capping layer to expose the upper surface of the substrate 1. Subsequently, a normal process may be performed to form the bit line BL, the bit line contact DC, the storage node contact BC, and the landing pads LP as described with reference to FIGS. 1, 2A and 2B.

The heat treatment process in S80 may be omitted. At a temperature of a deposition process for forming the word line capping pattern WC or a temperature of a deposition process for forming a subsequent metal wiring, the first and second silicon patterns SLP1 and SLP2, which are in an amorphous state, could change into a crystalline state, thereby forming the first and second silicon grains GRN1 and GRN2 of FIG. 3D. At this time, the relatively high-concentration first silicon pattern SLP1 may block the movement of the voids VD.

The semiconductor device according to embodiments may prevent/minimize the leakage current because the void in the silicon pattern of the word line is not in contact with the gate insulating layer. Meanwhile the electrical resistance of the word line may be reduced because the word line is not located on the center line of the silicon pattern. Accordingly, a semiconductor device having an improved reliability may be provided.

The method of fabricating the semiconductor device according to embodiments may allow a semiconductor device with the improved reliability to be fabricated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a substrate groove extending in a first direction;
a gate insulating layer conformally covering an inner wall of the substrate groove;
a metal-containing pattern on the gate insulating layer and filling a lower portion of the substrate groove;
a silicon pattern on the metal-containing pattern in the substrate groove; and
a word line capping pattern on the silicon pattern in the substrate groove,
wherein:
the silicon pattern includes:
a first silicon pattern covering an upper surface of the metal-containing pattern and a side surface of the gate insulating layer and having a pattern groove formed thereon; and
a second silicon pattern filling the pattern groove,
the first silicon pattern having a first impurity concentration, and
the second silicon pattern having a second impurity concentration that is less than the first impurity concentration.

2. The semiconductor device as claimed in claim 1, wherein:
the first silicon pattern has a first silicon grain average size, and
the second silicon pattern has a second silicon grain average size greater than the first silicon grain average size.

3. The semiconductor device as claimed in claim 1, further comprising a void region in the silicon pattern between the first silicon pattern and the second silicon pattern.

4. The semiconductor device as claimed in claim 1, wherein the first silicon pattern has a recessed upper surface, and an upper surface of the second silicon pattern is flat or upwardly convex.

5. The semiconductor device as claimed in claim 1, wherein:
the first silicon pattern has a first thickness at a sidewall of the gate insulating layer,
the second silicon pattern has a first width, and
the first thickness is 0.8 to 1.2 times the first width.

6. The semiconductor device as claimed in claim 1, wherein the second impurity concentration decreases towards a center of the second silicon pattern.

7. The semiconductor device as claimed in claim 1, further comprising a device isolation layer on the substrate to define an active region, wherein:
the metal-containing pattern includes a first conductive portion overlapping the device isolation layer and a second conductive portion not overlapping the device isolation layer, and
a first vertical length of the first conductive portion is greater than a second vertical length of the second conductive portion.

8. The semiconductor device as claimed in claim 1, wherein the silicon pattern further includes a void region spaced apart from a sidewall of the silicon pattern and not overlapping a center of the silicon pattern.

9. A semiconductor device, comprising:
a substrate having a substrate groove extending in a first direction;
a gate insulating layer conformally covering an inner wall of the substrate groove;
a metal-containing pattern on the gate insulating layer and filling a lower portion of the substrate groove;
a silicon pattern on the metal-containing pattern in the substrate groove; and
a word line capping pattern on the silicon pattern in the substrate groove,
wherein the silicon pattern includes:
a first silicon pattern covering an upper surface of the metal-containing pattern and a side surface of the gate insulating layer and having a pattern groove formed thereon; and
a second silicon pattern filling the pattern groove, and
wherein the first silicon pattern has a first silicon grain average size, and the second silicon pattern has a second silicon grain average size greater than the first silicon grain average size.

10. The semiconductor device as claimed in claim 9, wherein the first silicon pattern has a first impurity concentration, and the second silicon pattern has a second impurity concentration smaller than the first impurity concentration.

11. The semiconductor device as claimed in claim 10, wherein the second impurity concentration at a center of the second silicon pattern is lower than the second impurity concentration at an edge of the second silicon pattern.

12. The semiconductor device as claimed in claim 9, further comprising a void region within the silicon pattern and positioned between the first silicon pattern and the second silicon pattern.

13. The semiconductor device as claimed in claim 9, wherein the first silicon pattern has a recessed upper surface, and an upper surface of the second silicon pattern is flat or upwardly convex.

14. The semiconductor device as claimed in claim 9, wherein:
the first silicon pattern has a first thickness at a sidewall of the gate insulating layer,
the second silicon pattern has a first width, and
the first thickness is 0.8 to 1.2 times the first width.

15. The semiconductor device as claimed in claim 9, further comprising a device isolation layer on the substrate to define an active region, wherein:
the metal-containing pattern includes a first conductive portion overlapping the device isolation layer and a second conductive portion not overlapping the device isolation layer, and
a vertical length of the first conductive portion is greater than a vertical length of the second conductive portion.

16. The semiconductor device as claimed in claim 9, wherein the silicon pattern further includes a void region spaced apart from a sidewall of the silicon pattern and not overlapping a center of the silicon pattern.

17. A semiconductor device comprising:
a substrate having a substrate groove extending in a first direction;
a gate insulating layer conformally covering an inner wall of the substrate groove;
a metal-containing pattern on the gate insulating layer and filling a lower portion of the substrate groove;
a silicon pattern on the metal-containing pattern in the substrate groove;
a word line capping pattern on the silicon pattern in the substrate groove;

a first impurity region in the substrate at one side of the word line capping pattern;

a second impurity region in the substrate on the other side of the word line capping pattern;

a bit line extending in a second direction crossing the first direction on the substrate and connected to the first impurity region;

a bit line contact between the bit line and the first impurity region;

a bit line capping pattern on the bit line;

a storage node contact on the second impurity region; and a landing pad on the storage node contact and partially covering the bit line capping pattern, wherein the silicon pattern includes:

a first silicon pattern covering an upper surface of the metal-containing pattern and a sidewall of the gate insulating layer and having a pattern groove formed thereon;

a second silicon pattern filling the pattern groove; and a void region positioned between the first silicon pattern and the second silicon pattern, wherein:

the first silicon pattern has a first thickness at the sidewall of the gate insulating layer, the second silicon pattern has a first width, and the first thickness is 0.8 to 1.2 times the first width.

18. The semiconductor device as claimed in claim 17, wherein the first silicon pattern has a first impurity concentration, and the second silicon pattern has a second impurity concentration that is less than the first impurity concentration.

19. The semiconductor device as claimed in claim 17, wherein the first silicon pattern has a first silicon grain average size, and the second silicon pattern has a second silicon grain average size greater than the first silicon grain average size.

20. The semiconductor device as claimed in claim 17, wherein the first silicon pattern has a recessed upper surface, and an upper surface of the second silicon pattern is flat or upwardly convex.

* * * * *